US009058159B2

(12) United States Patent
Lee et al.

(10) Patent No.: US 9,058,159 B2
(45) Date of Patent: Jun. 16, 2015

(54) ELECTRONIC DEVICE WITH AIR GUIDING DUCT

(71) Applicant: HON HAI PRECISION INDUSTRY CO., LTD., New Taipei (TW)

(72) Inventors: Sheng-Hung Lee, New Taipei (TW); Li-Ping Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 223 days.

(21) Appl. No.: 13/779,988

(22) Filed: Feb. 28, 2013

(65) Prior Publication Data

US 2013/0301217 A1    Nov. 14, 2013

(30) Foreign Application Priority Data

May 14, 2012   (TW) .............................. 101117036 A

(51) Int. Cl.
| | |
|---|---|
| *G06F 1/20* | (2006.01) |
| *H05K 7/20* | (2006.01) |
| *G06F 1/18* | (2006.01) |
| *H01L 23/467* | (2006.01) |
| *F28F 27/02* | (2006.01) |

(52) U.S. Cl.
CPC .............. *G06F 1/20* (2013.01); *H05K 7/20145* (2013.01); *H05K 7/20727* (2013.01); *G06F 1/181* (2013.01)

(58) Field of Classification Search
CPC .......... G06F 1/20; H05K 7/20; H05K 20/727; H05K 20/145; H01L 23/467; F28F 27/02
USPC ............. 361/679.46–679.551, 690–697, 715, 361/719–724, 752; 165/80.2, 80.3, 80.4, 165/104.33, 121–126, 185; 174/15.1, 16.3, 174/252
See application file for complete search history.

(56) References Cited

U.S. PATENT DOCUMENTS

| | | | | |
|---|---|---|---|---|
| 6,330,154 | B1 * | 12/2001 | Fryers et al. ................... | 361/695 |
| 6,400,568 | B1 * | 6/2002 | Kim et al. ...................... | 361/697 |
| 6,462,948 | B1 * | 10/2002 | Leija et al. ..................... | 361/697 |
| 6,504,718 | B2 * | 1/2003 | Wu ................................ | 361/695 |
| 6,785,145 | B1 * | 8/2004 | Wong ............................ | 361/752 |
| 7,209,352 | B2 * | 4/2007 | Chen ............................. | 361/695 |
| 7,408,773 | B2 * | 8/2008 | Wobig et al. .................. | 361/695 |
| 7,573,712 | B2 * | 8/2009 | Wu et al. ....................... | 361/695 |
| 7,586,746 | B2 * | 9/2009 | Liu ................................ | 361/695 |
| 7,643,292 | B1 * | 1/2010 | Chen ............................. | 361/695 |
| 7,669,111 | B1 * | 2/2010 | Krause et al. ................. | 715/200 |
| 7,990,706 | B2 * | 8/2011 | Miyahara et al. ............. | 361/695 |
| 8,243,437 | B2 * | 8/2012 | Chou et al. ............... | 361/679.49 |
| 8,279,601 | B2 * | 10/2012 | Lima et al. .................... | 361/694 |
| 8,405,987 | B2 * | 3/2013 | Lai ................................ | 361/695 |
| 8,503,173 | B2 * | 8/2013 | Chiu et al. ............... | 361/679.54 |
| 8,717,763 | B2 * | 5/2014 | Lin et al. ....................... | 361/695 |
| 2008/0117589 | A1 * | 5/2008 | Carrera et al. ................ | 361/687 |
| 2008/0232066 | A1 * | 9/2008 | Wu et al. ....................... | 361/690 |

* cited by examiner

*Primary Examiner* — Michail V Datskovskiy
(74) *Attorney, Agent, or Firm* — Novak Druce Connolly Bove + Quigg LLP

(57) ABSTRACT

An electronic device includes an enclosure and a first air guiding duct mounted in the enclosure. The first air guiding duct includes a first part and a second part. The first part defines a first air channel and a second air channel. The second part defines a third air channel communicating with the first air channel and a fourth air channel located at a side of the second air channel. A guiding wall is located in the second air channel and extends from the second air channel to the fourth air channel. When air flows from the first part to the second part of the first air guiding duct, air flows from the first air channel to the third channel to cool a first electronic component, and flows from the second air channel to the fourth air channel by the guiding wall to cool a second electronic component.

19 Claims, 4 Drawing Sheets

ELECTRONIC DEVICE WITH AIR GUIDING DUCT

BACKGROUND

1. Technical Field

The present disclosure relates to electronic devices, more particularly to an electronic device with an air guiding duct.

2. Description of Related Art

Many expansion cards, such as sound cards, video cards, graphic cards, are provided in a computer chassis of a computer system. The expansion cards, especially the graphic cards, can generate a large amount of heat when operating. If the heat cannot be dissipated from the computer chassis, the performance of the expansion cards could be affected.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
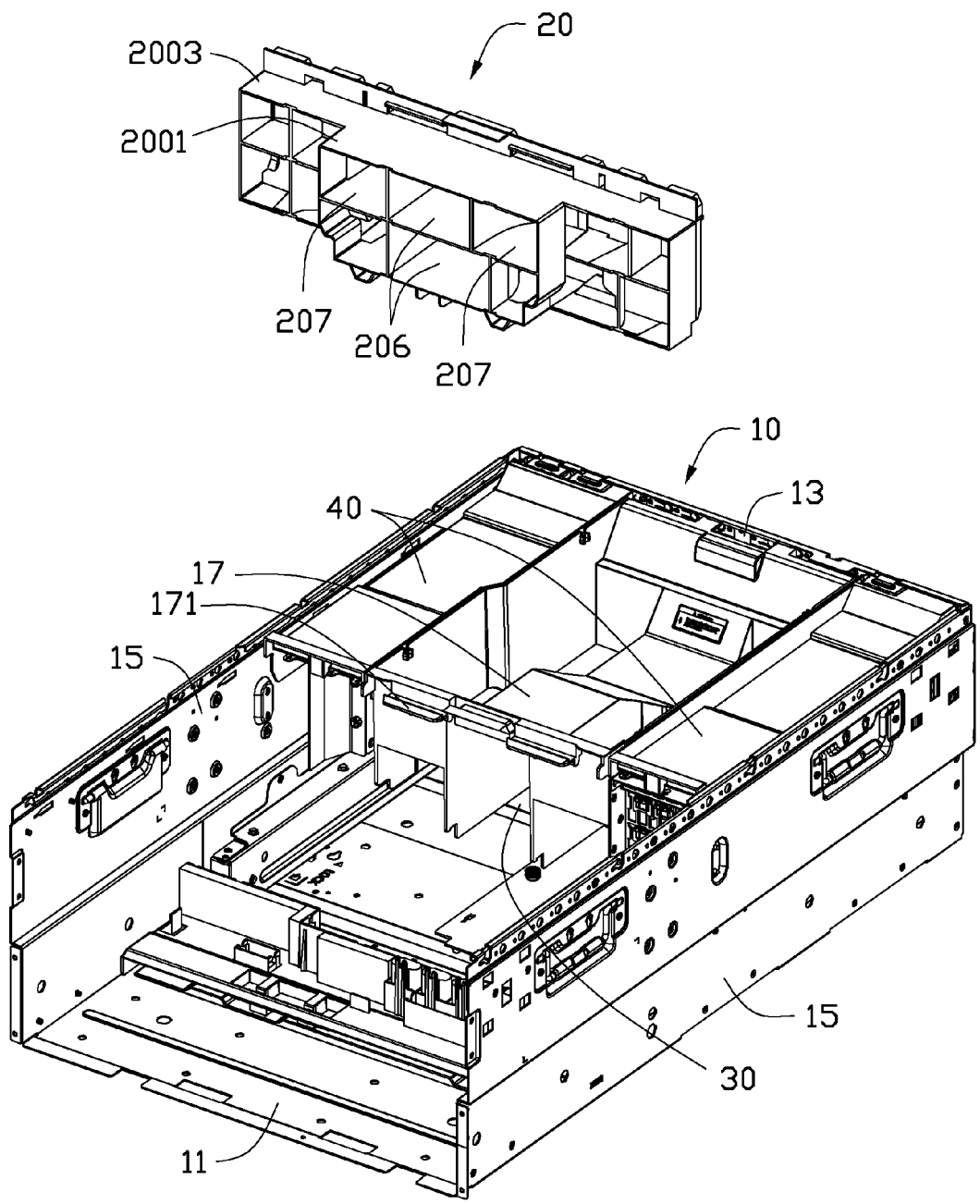
FIG. 1 is an exploded, isometric view of an electronic device in accordance with an embodiment.

FIG. 1 illustrates an electronic device of an embodiment. The electronic device comprises an enclosure 10 and a first air guiding duct 20. The electronic device may be a personal computer or a server, for example.

The enclosure 10 comprises a bottom plate 11, a rear plate 13, and two side plates 15. The rear plate 13 is substantially perpendicular to the bottom plate 11, and the two side plates 15 are substantially parallel to each other and substantially perpendicular to the bottom plate 11. A motherboard 30 is secured to the bottom plate 11. A first electronic component, such as a CPU (not shown), and a plurality of second electronic components, such as expansion cards (not shown) are located on the motherboard 30. Some expansion cards are located on one side of the CPU, and other expansion cards are located on an opposite side of the CPU. A second air guiding duct 17 is located in the enclosure 10 and above the motherboard 30 to cover a heat dissipating member, which is mounted on the motherboard 30 above the CPU. Two covers 40 are located in the enclosure 10 at two opposite sides of the CPU to cover the plurality of expansion cards, such as sound cards, video cards, graphic cards, for example. The second air guiding duct 17 defines a first air flow path (not labeled) through the heat dissipating member of the CPU. Each cover 40 defines a second air path (not labeled) through the corresponding expansion cards.

Figure 2:
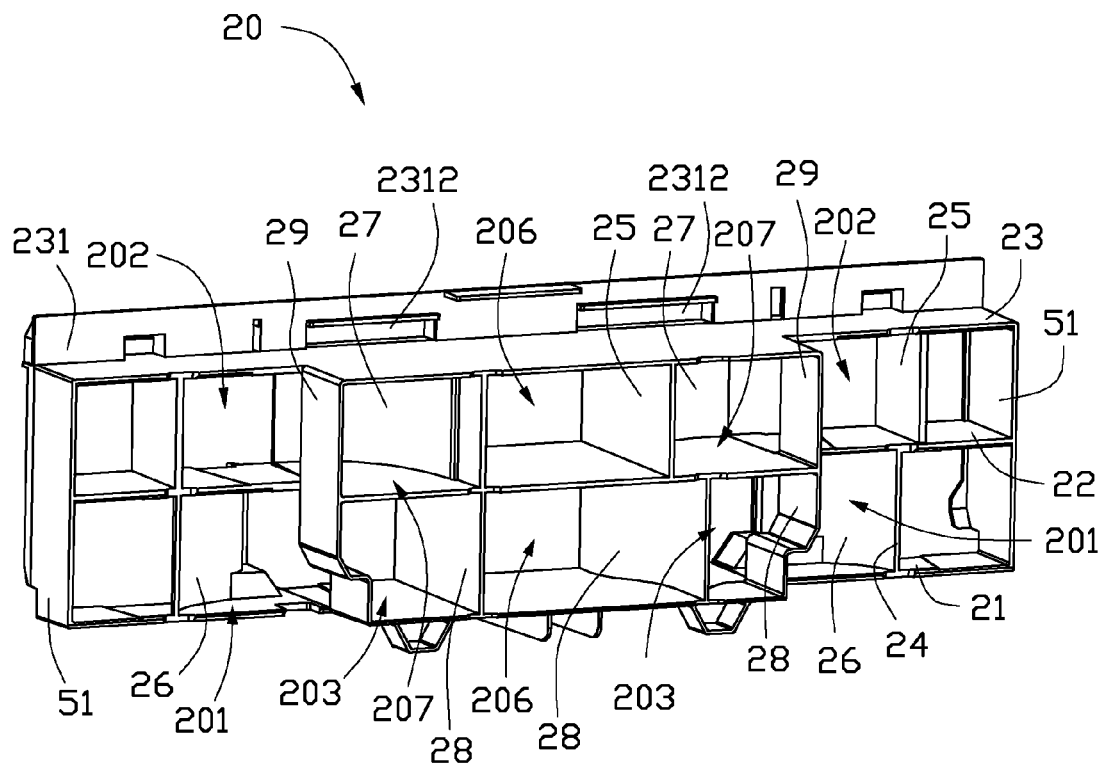
FIG. 2 is an isometric view of a first air guiding duct of the electronic device of FIG. 1.
Figure 3:
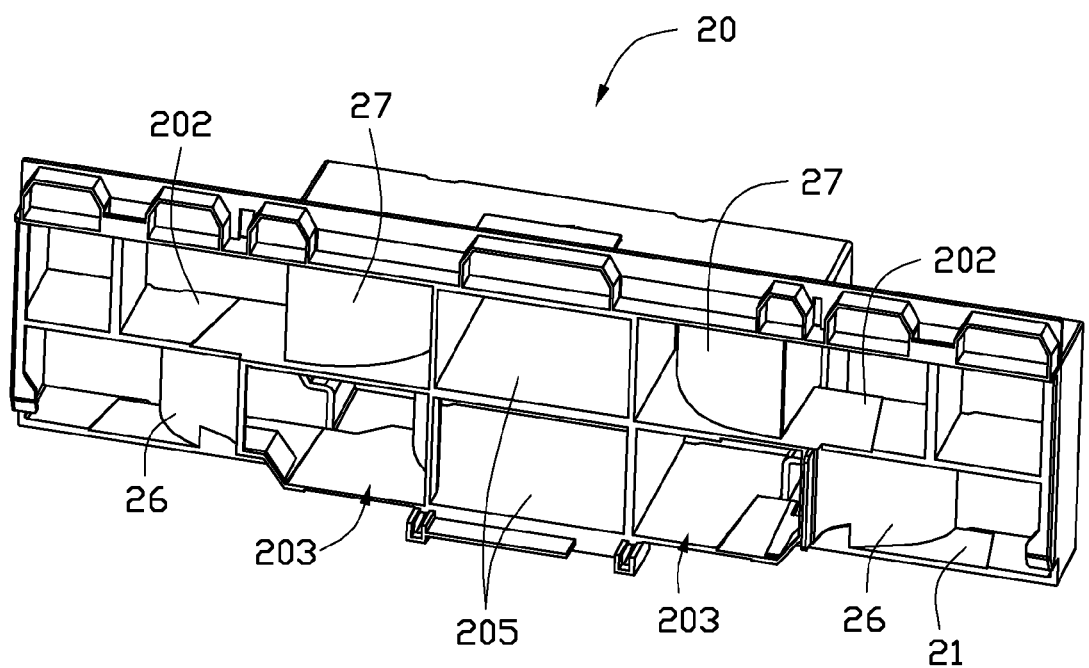
FIG. 3 is similar to FIG. 2, but viewed from a different aspect.
Figure 4:
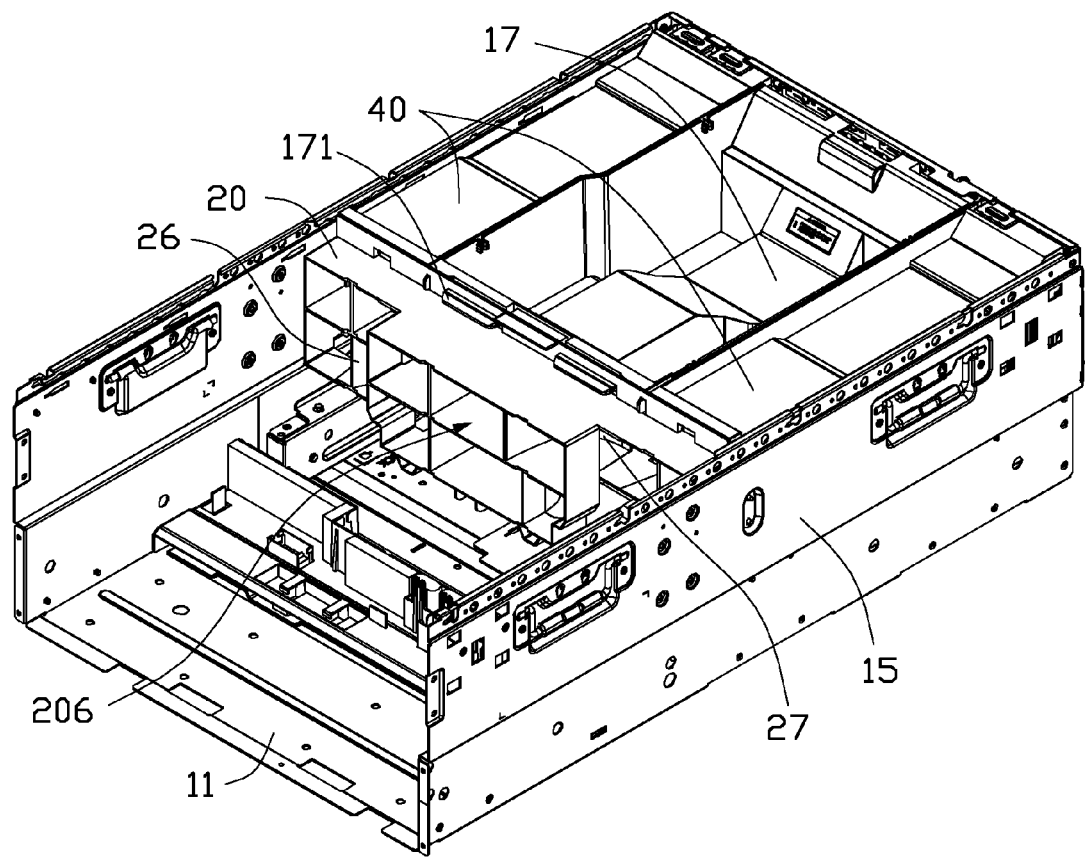
FIG. 4 is an isometric view of assembly of the electronic device of FIG. 1.

The first air guiding duct 20 comprises a first part 2001 and a second part 2003 located on the first part 2001. The first part 2001 defines two first air channels 206 and two second air channels 207 at two opposite sides of the two first air channels 206. FIG. 3 shows that the second part 2003 defines two third air channels 205 and two fourth air channels 202. Each of the two third air channels 205 communicates with each of the two first air channels 206. The two fourth air channels 202 are located at two opposite sides of the two third air channels 205. FIGS. 2 and 3 show that a first guiding wall 27 is located in each of the two second air channels 207 extending from each of the two second air channels 207 to each of the two fourth air channels 202. FIG. 4 shows that the first air duct is 20 is located in the enclosure 10 at one side of the second air guiding duct 17 and the two covers 40. When air flows from the first part 2001 to the second part 2003 of the first air guiding duct 20, air can pass from one of the two first air channels 206 to one of the two third air channels 205 and through the first air flow path to cool a CPU. In addition, air flows from the two second air channels 207 to the two fourth air channels 202 by the first guiding walls 27 and through the second air flow paths, for cooling the plurality of expansion cards.

FIGS. 2 and 3 show that the first air guiding duct 20 comprises a first wall 23, a second wall 22, two first sidewalls 29, and two second sidewalls 51. The two first sidewalls 29 and the two second sidewalls 51 are secured to the first wall 23 and the second wall 22. A part of the first wall 23, a part of the second wall 22, and the two first sidewalls 29 cooperatively define the first part 2001 of the first air guiding duct 20. Another part of the first wall 23, another part of the second wall 22, and the two second sidewalls 51 cooperatively define the second part 2003 of the first air guiding duct 20. The first guiding walls 27 are located between and connect the first wall 23 and the second wall 22. A plurality of first separated walls 25 are located between the first wall 23 and the second wall 22 separating one of the two first air channels 206 and the two second air channels 207 and separating one of the two third air channels 205 and the two fourth air channels 202. The first guiding wall 27 extends from two of the plurality of first separated walls 25, located in the first part 2001 of the first air guiding duct 20. A mounting flange 231 extends from the first wall 23. The mounting flange 231 defines two locking openings 2312. FIG. 1 shows that the second air guiding duct 17 comprises two locking pieces 171. FIG. 4 shows that the two locking pieces 171 are engaged in the two locking openings 2312 securing the first air guiding duct 20 to the second air guiding duct 17.

In an embodiment, the first wall 23 is substantially parallel to the second wall 22 and substantially perpendicular to the two first sidewalls 29 and the two second sidewalls 51. The first guiding wall 27 is an arc-shaped wall. The plurality of first separated walls 25 are substantially parallel to the two first sidewalls 29 and the two second sidewalls 51 and substantially perpendicular to the first wall 23 and the second wall 22. The mounting flange 231 is substantially perpendicular to the first wall 23.

The first air guiding duct 20 defines two fifth air channels 203 through the first part 2001 and the second part 2003, and each of the two fifth air channels 203 is located below each of the two second air channels 207. The second part 2003 further defines two sixth air channels 201 each located below each of the two fourth air channels 202 and at two opposite sides of the two fifth air channels 203. A second guiding wall 26 is located in each of the two sixth air channels 201, for directing air from each of the two fifth air channels 203 to each of the two sixth air channels 201 to cool the expansion cards. The first air guiding duct 20 further comprises a third wall 21. The second wall 22 is located between the first wall 23 and the third wall 21. Two second separated walls 28 are located in the first air guiding duct between the second wall 22 and the third wall 21 separating one of the two first air channels 206 and the two fifth air channels 203. FIG. 6 shows when the first air guiding duct 20 is secured to the second air guiding duct 17, the two sixth air channels 201 face the expansion cards, and the two fifth air channels 203 and the one first air channel 206 face the first air guiding duct 17. Air flows through the first air guiding duct 20 from the first part 2001 to the second part 2003. Air flows through the two fifth air channels 203 and the one first air channel 206 to the second air guiding duct 17 to cool the CPU. In addition, air flows in the two fifth air channels 203 and is directed to the two sixth air channels 201 by the second guiding walls 26 to cool the expansion cards which are covered by the two covers 40.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. An electronic device comprising:
an enclosure; and
a first air guiding duct mounted in the enclosure, the first air guiding duct comprising a first part and a second part, the first part defining a first air channel and a second air channel, the second part defining a third air channel and a fourth air channel, the third air channel communicating with the first air channel, the fourth air channel being located at a side of the second air channel, a guiding wall being located in the second air channel and extending from the second air channel to the fourth air channel;
wherein when air flows from the first part to the second part of the first air guiding duct, air flows from the first air channel to the third channel to cool a first electronic component, and flows from the second air channel to the fourth air channel by the guiding wall to cool a second electronic component.

2. The electronic device of claim 1, wherein the first air guiding duct comprises a first wall, a second wall, two first sidewalls, and two second sidewalls; the two first sidewalls and the two second sidewalls are secured to the first wall and the second wall; a part of the first wall, a part of the second wall, and the two first sidewalls cooperatively define the first part of the first air guiding duct; and another part of the first wall, another part of the second wall, and the two second sidewalls cooperatively define the second part of the first air guiding duct.

3. The electronic device of claim 2, wherein the guiding wall is located between the first wall and the second wall.

4. The electronic device of claim 3, wherein the guiding wall is arc-shaped.

5. The electronic device of claim 2, wherein the first air guiding duct further comprises a separated wall located between the first wall and the second wall and separates the first air channel and the second air channel and separates the third air channel and the fourth air channel.

6. The electronic device of claim 5, wherein the guiding wall extends from a part of the separated wall, which is located in the first part of the first air guiding duct.

7. The electronic device of claim 2, wherein the first air guiding duct further comprises a mounting flange extending from the first wall; the mounting flange defines a locking opening; the enclosure comprises a second air guiding duct for covering the first electronic component; the second air guiding duct defines a first air flow path communicating the first air channel and the third air channel, the enclosure further comprises a locking piece extending from the second air guiding duct and engaged in the locking opening to secure the first air guiding duct to the second air guiding duct.

8. The electronic device of claim 7, wherein the mounting flange is substantially perpendicular to the first wall.

9. The electronic device of claim 2, wherein the first wall is substantially parallel to the second wall, the two first sidewalls are substantially parallel to each other and substantially perpendicular to the first wall, and the two second sidewalls are substantially parallel to each other and substantially perpendicular to the first wall.

10. The electronic device of claim 1, wherein the enclosure comprises a cover for covering the second electronic component, and the cover defines a second air flow path communicating the fourth air channel.

11. An air guiding duct for an electronic device, the air duct comprising:
a first part defining a first air channel and a second air channel; and
a second part defining a third air channel and a fourth air channel, the third air channel communicating with the first air channel, the fourth air channel located at a side of the second air channel, a guiding wall being located in the second air channel and extending from the second air channel to the fourth air channel; wherein
when air flows from the first part to the second part of the air guiding duct, air flows from the first air channel to the third channel to cool a first electronic component, and flows from the second air channel to the fourth air channel by the guiding wall to cool a second electronic component.

12. The air guiding duct of claim 11, wherein the air guiding duct comprises a first wall, a second wall, two first sidewalls, and two second sidewalls; the two first sidewalls and the two second sidewalls are secured to the first wall and the second wall; a part of the first wall, a part of the second wall, and the two first sidewalls cooperatively define the first part of the air guiding duct; and another part of the first wall, another part of the second wall, and the two second sidewalls cooperatively define the second part of the air guiding duct.

13. The air guiding duct of claim 12, wherein the guiding wall is located between the first wall and the second wall.

14. The air guiding duct of claim 13, wherein the guiding wall is arc-shaped.

15. The air guiding duct of claim 12, wherein the air guiding duct further comprises a separated wall located between the first wall and the second wall and separates the first air channel and the second air channel and separates the third air channel and the fourth air channel.

16. The air guiding duct of claim 15, wherein the guiding wall extends from a part of the separated wall, which is located in the first part of the air guiding duct.

17. The air guiding duct of claim 12, wherein the air guiding duct further comprises a mounting flange extending from the first wall; the mounting flange defines a locking opening to receive a locking piece of a second air guiding duct.

18. The air guiding duct of claim 17, wherein the mounting flange is substantially perpendicular to the first wall.

19. The air guiding duct of claim 12, wherein the first wall is substantially parallel to the second wall, the two first sidewalls are substantially parallel to each other and substantially perpendicular to the first wall, and the two second sidewalls are substantially parallel to each other and substantially perpendicular to the first wall.

* * * * *